United States Patent
Tsunetsugu et al.

(10) Patent No.: US 7,042,195 B2
(45) Date of Patent: May 9, 2006

(54) METHOD OF CONTROLLING PHOTOVOLTAIC POWER GENERATION SYSTEM

(75) Inventors: Katsuki Tsunetsugu, Osaka (JP); Toshikazu Noda, Osaka (JP)

(73) Assignee: Daihen Corporation, Osaka (JP)

( * ) Notice: Subject to any disclaimer, the term of this patent is extended or adjusted under 35 U.S.C. 154(b) by 0 days.

(21) Appl. No.: 11/220,109

(22) Filed: Sep. 6, 2005

(65) Prior Publication Data

US 2006/0055366 A1    Mar. 16, 2006

(30) Foreign Application Priority Data

Sep. 13, 2004  (JP)  ............... 2004-265021
May 9, 2005    (JP)  ............... 2005-135771

(51) Int. Cl.
*H01M 10/44* (2006.01)
(52) U.S. Cl. ..................................................... 320/101
(58) Field of Classification Search ................ 320/101; 136/243; 700/89; 703/18
See application file for complete search history.

(56) References Cited

U.S. PATENT DOCUMENTS 5,682,305 A * 10/1997 Kurokami et al. ............ 363/79
2004/0207366 A1* 10/2004 Sung ........................... 320/140

FOREIGN PATENT DOCUMENTS

JP    2001-325031    11/2001

* cited by examiner

*Primary Examiner*—Karl Easthom
*Assistant Examiner*—Aaron Piggush
(74) *Attorney, Agent, or Firm*—Hamre, Schumann, Mueller & Larson, P.C.

(57) ABSTRACT

A conventional hill climbing method is not capable of tracking a maximum power when a shadow covers a part of a solar cell panel and a plurality of maximal values is thereby developed. The invention provides a photovoltaic power generation system control method that controls a photovoltaic output setting value to be an appropriate value by following up a variation in the solar irradiation, including a genetic algorithm process of employing the photovoltaic output setting value as a gene and the output power as an evaluation value thereof; randomly extracting a plurality of genes and repeating storage, selection and crossover/mutation of the output powers which are the evaluation values of the genes, so as to converge a difference between a maximum and minimum values of the output voltages into a predetermined range; and a hill climbing process of setting the photovoltaic output setting value corresponding to the greatest value of the converged output voltages, and a greater and a lower value than the photovoltaic output setting value by a predetermined amount, so as to select the greatest output power among these values; and repeating such steps to track the maximum output power.

16 Claims, 7 Drawing Sheets

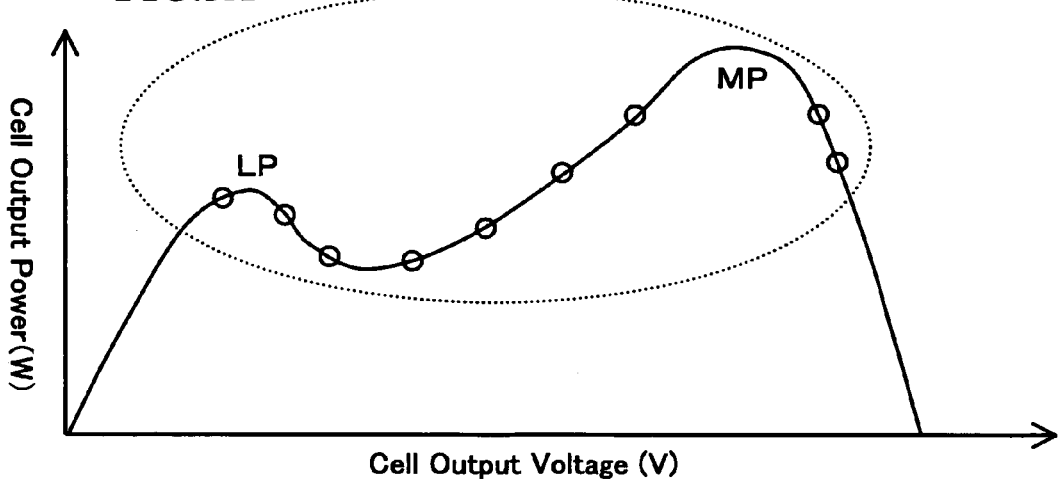
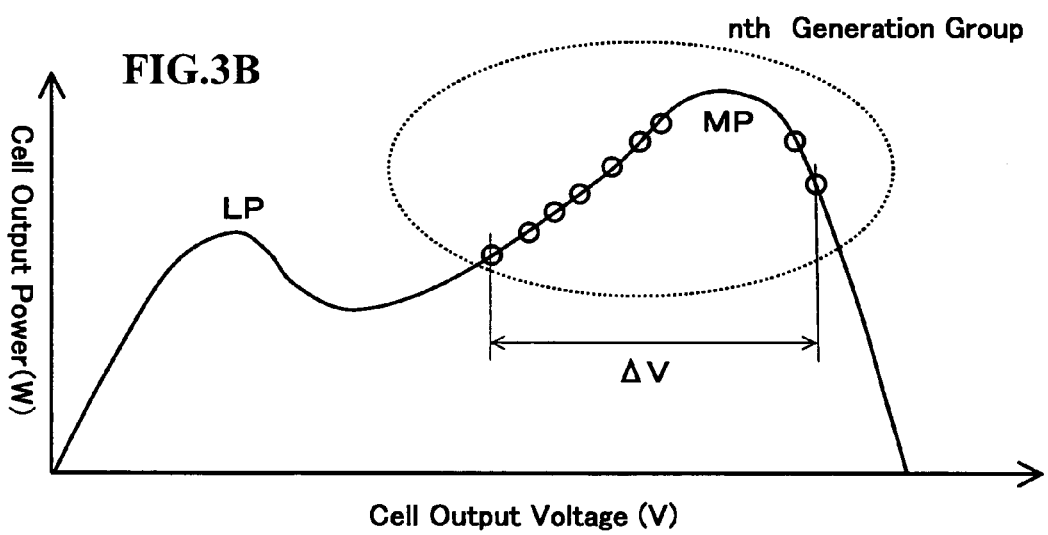
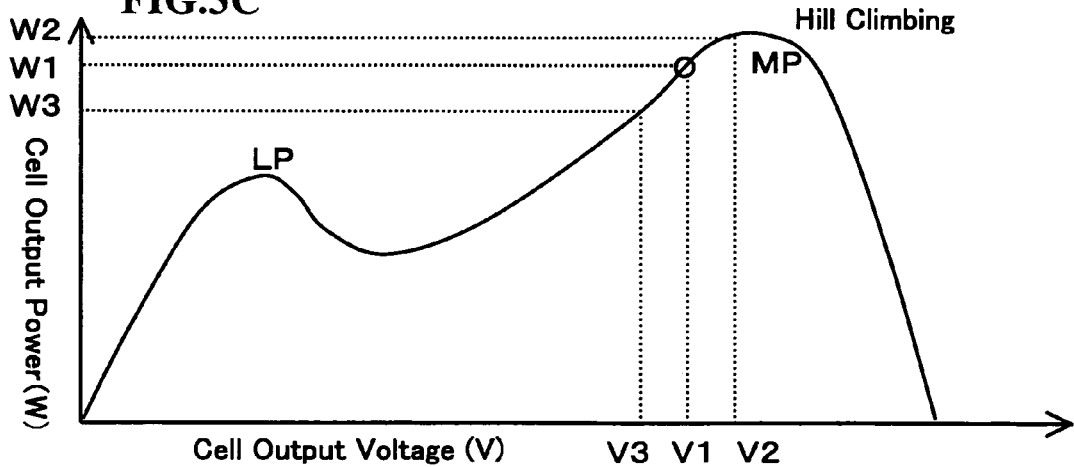

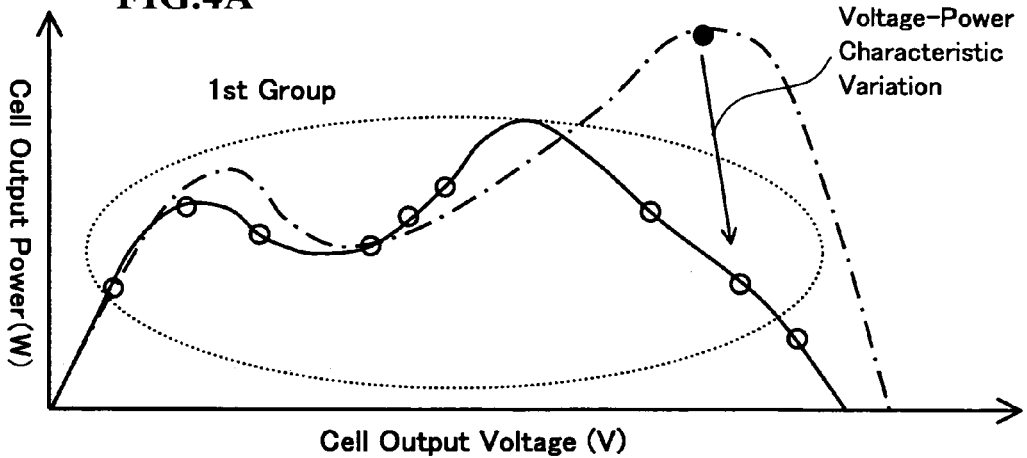
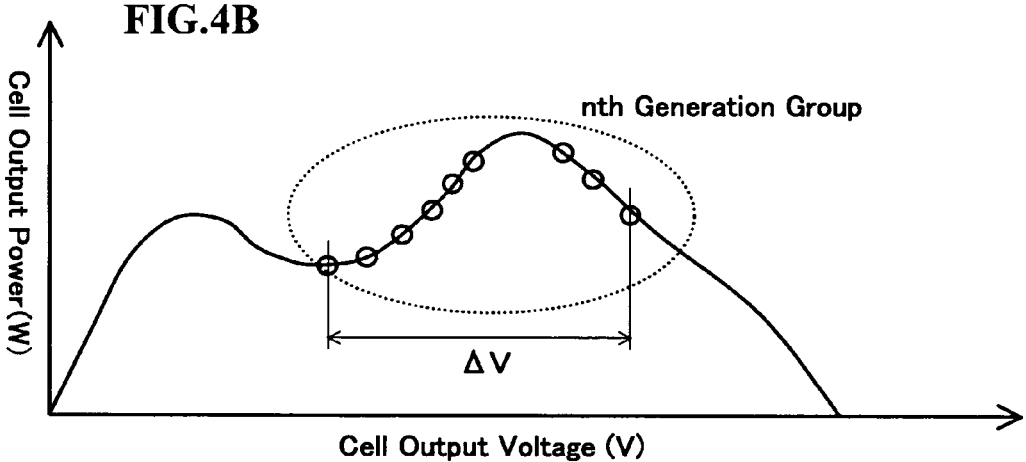
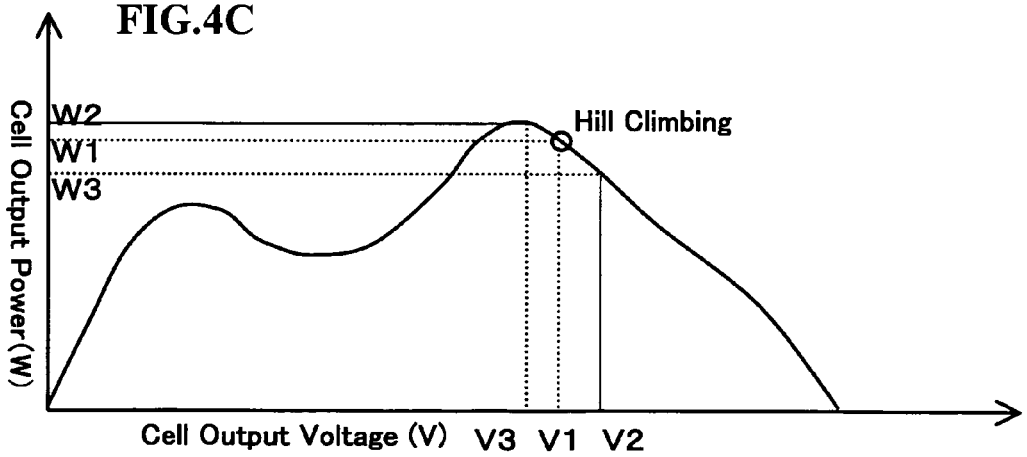

METHOD OF CONTROLLING PHOTOVOLTAIC POWER GENERATION SYSTEM

BACKGROUND OF THE INVENTION

1. Field of the Invention

The present invention relates to a photovoltaic power generation system for maximizing the output power from a solar cell. In particular, it relates to a technique for precisely tracking the maximum output power among a plurality of local maximum powers resulting from uneven solar irradiation to a solar cell panel.

2. Description of the Related Art

FIG. 5 is a block diagram showing a conventional photovoltaic power generation system. In the figure, SC1 to SC3 designate three solar cells connected in parallel. PT designates an output voltage detector that detects the output voltage of the solar cells. CT designates an output current detector that detects the output current of the solar cells. CC designates a controller including a microprocessor that performs MPPT (Maximum Power Point Tracking) control by using a hill climbing method (hereinafter referred to as "hill climbing method HC"). The controller CC includes an A/D converter into which the output voltage and the output current of the solar cells are input. IN designates a DC/AC inverter (or a DC/DC converter) that converts the DC output from the solar cells into a voltage. AD designates a load, and SP a commercially available power source for the system.

With the above arrangement, the microprocessor of the controller CC multiplies the output voltage and the output current of the solar cells SC to calculate the output power of the solar cells SC, and causes the output voltage and the calculated power to be stored in a memory. The microprocessor of the controller CC also outputs a "photovoltaic output setting value" for controlling the output of the DC/AC inverter IN via a pulse width modulator PWM, thereby controlling the output voltage of the solar cells SC.

FIG. 6 is a flowchart for explaining the hill climbing method employed in the conventional power generation system. The operation of the photovoltaic power generation system will be described below by using this flowchart, and FIG. 7 showing how the local maximum is tracked.

Specifically, a first photovoltaic output setting value, corresponding to the point A on the power-voltage characteristic graph shown in FIG. 7, is provided as an initial setting value from the controller CC (step S1) to operate the inverter in a certain mode. In this state, a first photovoltaic output voltage V1 from the solar cells SC is measured (step S2). Likewise, a first photovoltaic output current I1 is measured (step S3). Then, the microprocessor of the controller CC multiplies the measured voltage V1 and current I1 to calculate a first photovoltaic output power W1. The calculated output power W1 and the first photovoltaic output voltage V1 are stored in the memory (step S4).

Then, a second photovoltaic output setting value greater than the first photovoltaic output setting value is provided to operate the inverter, so that the first photovoltaic output voltage V1 shown in FIG. 7 is increased to a second photovoltaic output voltage V2 (step S5).

In this situation, a second photovoltaic output current I2 is measured (step S6). Then, the microprocessor of the controller CC multiplies the second photovoltaic output voltage V2 and output current I2 to calculate a second photovoltaic output power W2. Again, the calculated power W2 and the second photovoltaic output voltage V2 are stored in the memory (step S7).

Further, a third photovoltaic output setting value lower than the first photovoltaic output setting value is provided to operate the inverter, so that a third photovoltaic output voltage V3 lower than the first voltage V1 is obtained (step S8). In this situation, a third photovoltaic output current I3 is measured (step S9), and then the voltage V3 and the current I3 are multiplied to calculate a third photovoltaic output power W3. The calculated power W3 and the voltage V3 are stored in the memory (step S10).

The stored output powers W1, W2 and W3, corresponding to the output voltages V1, V2 and V3 (V3<V1<V2), are compared to find the greatest value, which is V2 in this case. Thus, the initial point A shown in FIG. 7 is shifted upward along the graph to a point B that corresponds to the greatest voltage V2. Thereafter, such a series of steps is repeated until the maximum power point MP1 is reached. The hill climbing technique is disclosed in JP-A-2001-325031, for example.

The conventional hill climbing method described above is found disadvantageous in the following points.

When all the solar cells SC are equally irradiated by the sun, a one-humped curve such as the one illustrated in solid in FIG. 7 will appear. However, the state of the solar irradiation onto the solar cells changes (a shadow is cast over a portion of the panels, for example), the voltage-power characteristic is varied, and a two-humped curve for example may appear, as shown in broken lines in FIG. 7. The illustrated two-humped curve has two local maximums: a lower maximum LP and a higher maximum MP2. In this case, if a point C is chosen for the starting point in performing the above-described hill climbing method, the real maximum point MP2 can be reached. However, if the point A is chosen for the starting point, the tracking will end when the local maximum point LP is reached, which is not the real maximum point (which is point MP2).

As readily understood, the situation will become worse when the voltage-power curve has more than two humps (that is, local maximums). In such a case, the conventional hill climbing method is powerless for finding the maximum power point, and hence the power generation system fails to operate in the maximum power mode.

SUMMARY OF THE INVENTION

The present invention has been proposed under the circumstances described above. It is therefore an object of the present invention to provide a method of controlling a photovoltaic power generation system that is capable of overcoming the conventional problem.

To achieve the foregoing object, a first aspect of the present invention provides a control method of a photovoltaic power generation system including controlling an inverter such that an output voltage or an output current from a solar cell becomes generally equal to a photovoltaic output setting value, so as to track a variation in a photovoltaic voltage-power characteristic caused by a change in the solar irradiation, thereby controlling the photovoltaic output setting value to be an appropriate value that makes the output power of the solar cell generally equal to a maximum value, comprising:

a genetic algorithm process including employing a GA controller based on a genetic algorithm in which the photovoltaic output setting value serves as a gene and the output power of the solar cell serves as an evaluation value of the gene; a first step including extracting a plurality of genes randomly or according to a predetermined condition out of a setting range of the photovoltaic output setting value thus to form an initial group of a first generation, sequentially activating the inverter based on each photovoltaic output setting value respectively corresponding to each gene of the initial group and storing the output power from the solar cell under operation as the evaluation value of each of the genes, and inputting the genes of the initial group in the GA controller, so that the GA controller selects the genes and causes the selected genes to crossover/mutate based on the evaluation value thereof, so as to output a predetermined number of genes thus to form a second generation group; a second step including sequentially activating the inverter based on the photovoltaic output setting values corresponding to the genes of the second generation group and storing the output power from the solar cell under operation as the evaluation value of each of the genes, and inputting the second generation genes in the GA controller, so that the GA controller selects the genes and causes the selected genes to crossover/mutate based on the evaluation value thereof, so as to output a predetermined number of genes thus to form a third generation group; and repeating the second step so as to converge the genes thus to update the generation of the gene group, until a difference between a maximum value and a minimum value among the photovoltaic output setting values corresponding to the genes falls within a predetermined range; and a hill climbing process including selecting a photovoltaic output setting value that has the greatest evaluation value among the converged genes as a reference photovoltaic output setting value; generating a value greater by a predetermined amount and lower by a predetermined amount than the reference photovoltaic output setting value; sequentially activating the inverter based on the three photovoltaic output setting values so as to set the photovoltaic output setting value that gives the greatest output power as an updated reference photovoltaic output setting value; and repeating such steps, so as to return to the genetic algorithm process when a predetermined switching condition for following up the variation in the photovoltaic voltage-power characteristic is satisfied.

A second aspect of the present invention provides the control method of a photovoltaic power generation system according to the first aspect, further comprising performing, upon starting the control of the photovoltaic power generation system, the hill climbing process utilizing a predetermined photovoltaic output setting value as the reference photovoltaic output setting value, prior to performing the genetic algorithm process.

A third aspect of the present invention provides the control method of a photovoltaic power generation system according to the first or the second aspect, wherein the hill climbing process includes specifying the switching condition as when the hill climbing process has been performed for a predetermined duration of time.

A fourth aspect of the present invention provides the control method of a photovoltaic power generation system according to the first or the second aspect, wherein the hill climbing process includes specifying the switching condition as when the output power has fluctuated by more than a predetermined value with respect to the output power of the preceding step.

A fifth aspect of the present invention provides the control method of a photovoltaic power generation system according to the first or the second aspect, wherein the hill climbing process includes specifying the switching condition as when the output power has fluctuated by more than a predetermined value with respect to the output power of the preceding step, and when the hill climbing process has been performed for a predetermined duration of time.

A sixth aspect of the present invention provides the control method of a photovoltaic power generation system according to any of the first to the fifth aspects, further comprising forming the initial group containing the genes corresponding to the reference photovoltaic output setting value of the last step of the hill climbing process, at a transition from the hill climbing process to the genetic algorithm process.

According to the first to the sixth aspects of the present invention, even when the solar irradiation on the solar cell changes so as to cast a shadow on a portion of the panel such that the photovoltaic voltage-power characteristic presents a plurality of maximal values, the genetic algorithm process allows searching for a value close to the maximum maximal value, and the hill climbing process allows quickly reaching the maximum maximal value. Therefore, a shift of the maximum output power point caused by a variation in the solar irradiation can be effectively followed up.

According to the second aspect, starting with the hill climbing process allows quickly reaching the maximum output power point at the time of starting the control of the photovoltaic power generation system, in the case where the solar cell panel is installed at a location free from a shadow.

Further, according to the fifth aspect, the operation is switched to the genetic algorithm process when a variation in the solar irradiation has been detected and when the hill climbing process has been performed for a predetermined duration of time. This prevents the hill climbing process from being frequently performed too shortly, thus increasing an overall working efficiency of the photovoltaic power generation system.

Further, according to the sixth aspect, including a gene that has a high evaluation value in the initial group improves the converging speed of the genes in the genetic algorithm process.

Other features and advantages of the present invention will become apparent from the detailed description given below with reference to the accompanying drawings.

BRIEF DESCRIPTION OF THE DRAWINGS

FIGS. 3A to 3C are graphs for explaining the tracking of the maximal value in the embodiment of the present invention;

FIGS. 4A to 4C are graphs for explaining the tracking of the maximal value in a different case in the embodiment of the present invention;

BEST MODE FOR CARRYING OUT THE INVENTION

Figure 1:
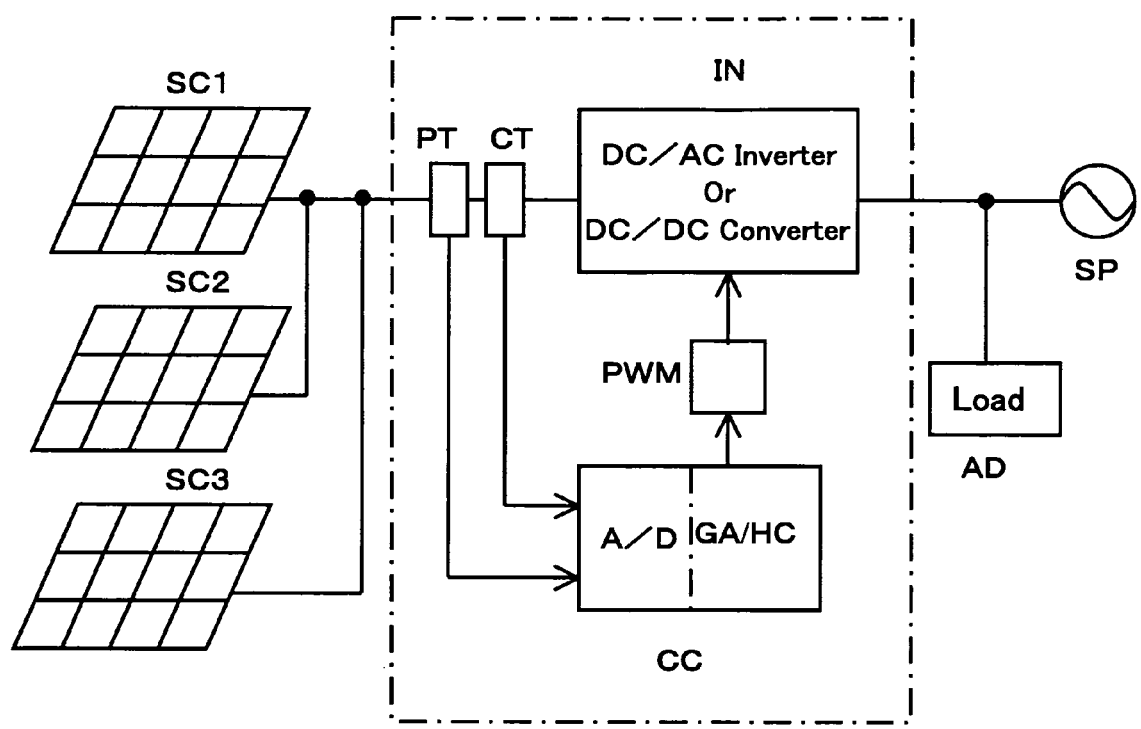
FIG. 1 is a block diagram showing a configuration of a photovoltaic power generation system according to an embodiment of the present invention.
Figure 5:
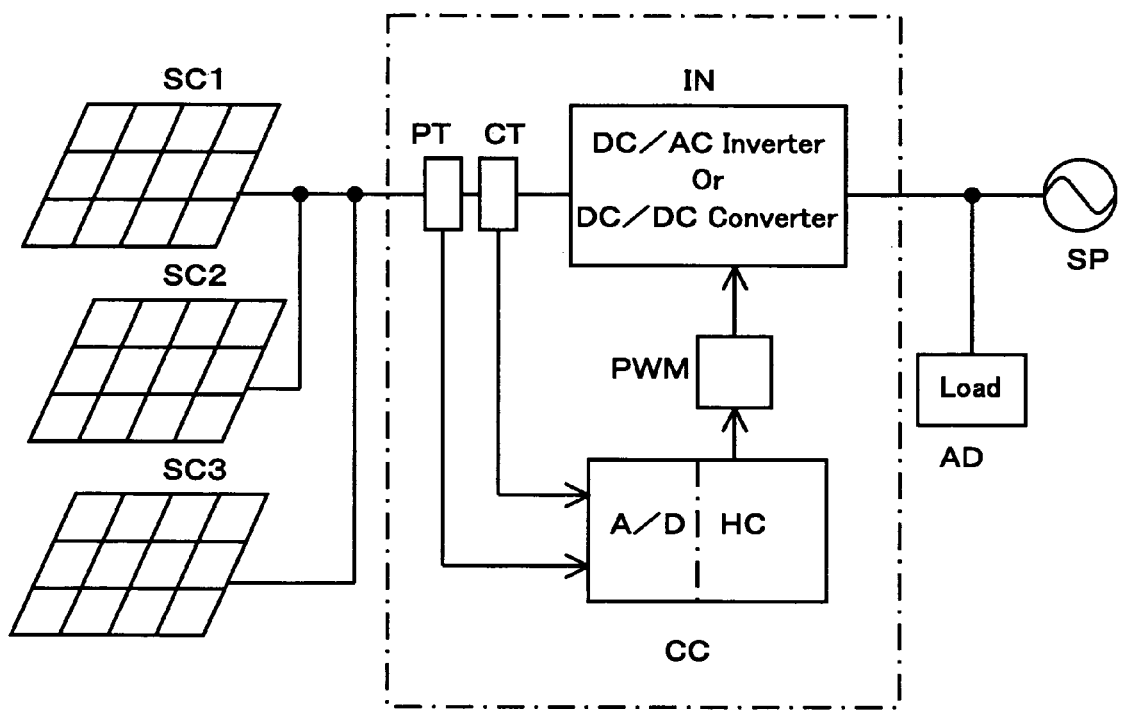
FIG. 5 is a block diagram showing the configuration of a conventional photovoltaic power generation system.

FIG. 1 is a block diagram showing the configuration of a photovoltaic power generation system according to the present invention. In the figure, elements identical or similar to those shown in FIG. 5 are indicated by the same symbols, and their detailed description may be omitted below since their functions are the same as or similar to those of the conventional elements.

Referring to the block diagram shown in FIG. 1, the controller CC incorporates a microprocessor for performing a genetic algorithm (GA) control and a hill climbing control (HC). The microprocessor of the controller CC multiplies the output voltage and output current of the solar cells SC thus to-calculate the output power of the solar cells SC, and causes the output voltage and output power values to be stored in a memory. The controller CC also controls the output of the DC/AC inverter IN via the pulse width modulator PWM, thereby controlling the output voltage from the solar cells SC.

In general, the genetic algorithm (GA) control proceeds as follows. First, a predetermined number of photovoltaic output setting values, each regarded as a gene, are prepared. Each gene can be evaluated by an "evaluation value" corresponding to the output power of the solar cells. Then, a plurality of genes are randomly extracted from the initially prepared genes (i.e., photovoltaic output setting values) to form a initial gene group. Then, this initial group of genes is subjected to "selection", "crossover" and "mutation" to form a second gene group (Second Generation).

Thereafter, the above-described process is repeated, as required, to produce another or other gene groups. Each of these gene groups includes the maximum and the minimum photovoltaic output setting values. The gene group production process continues until the difference between the maximum and the minimum is small enough to fall in a predetermined range. Thereafter, the hill climbing control (HC) is performed in the following manner.

Figure 6:
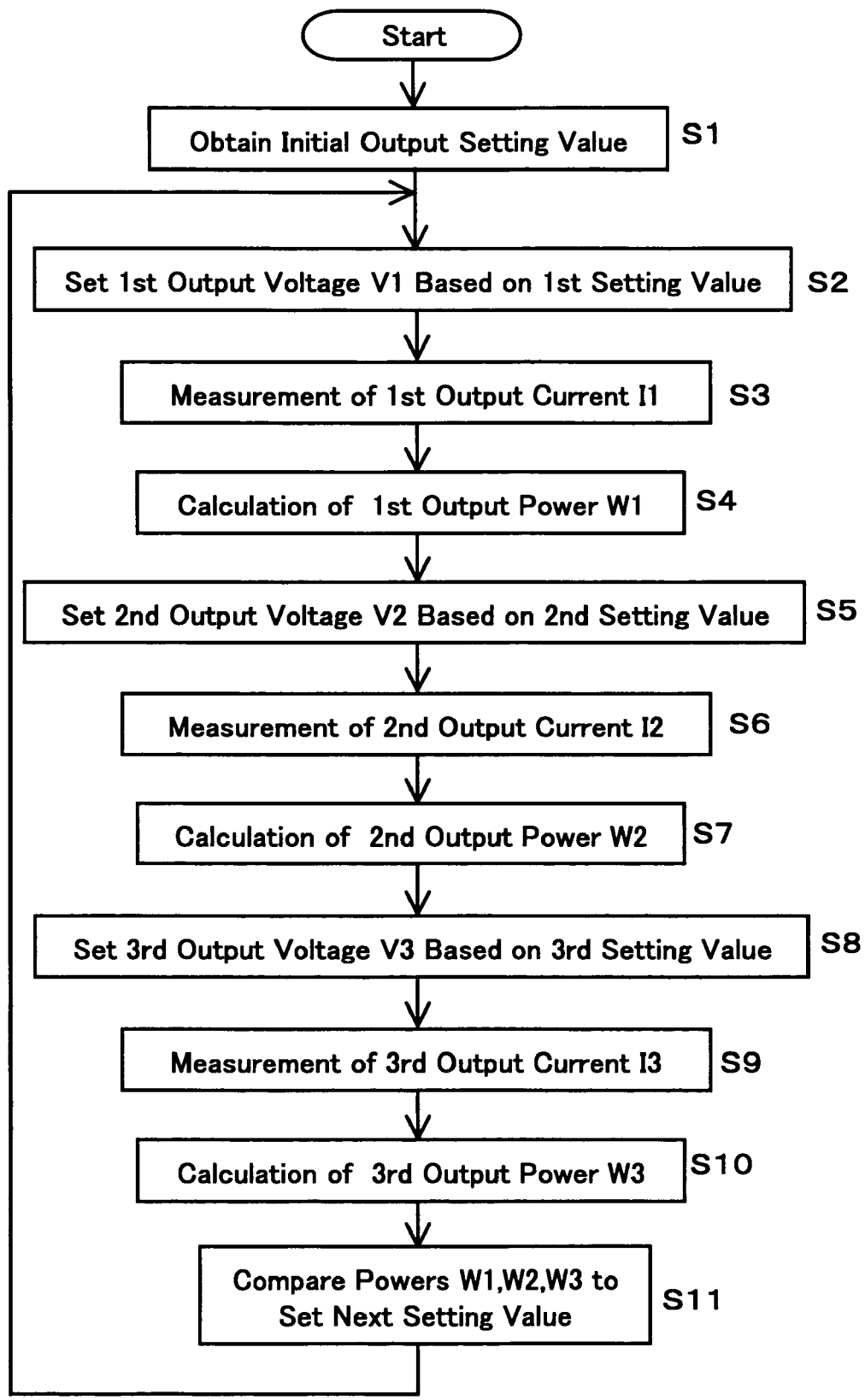
FIG. 6 is a flowchart for explaining the operation of the conventional system.
Figure 7:
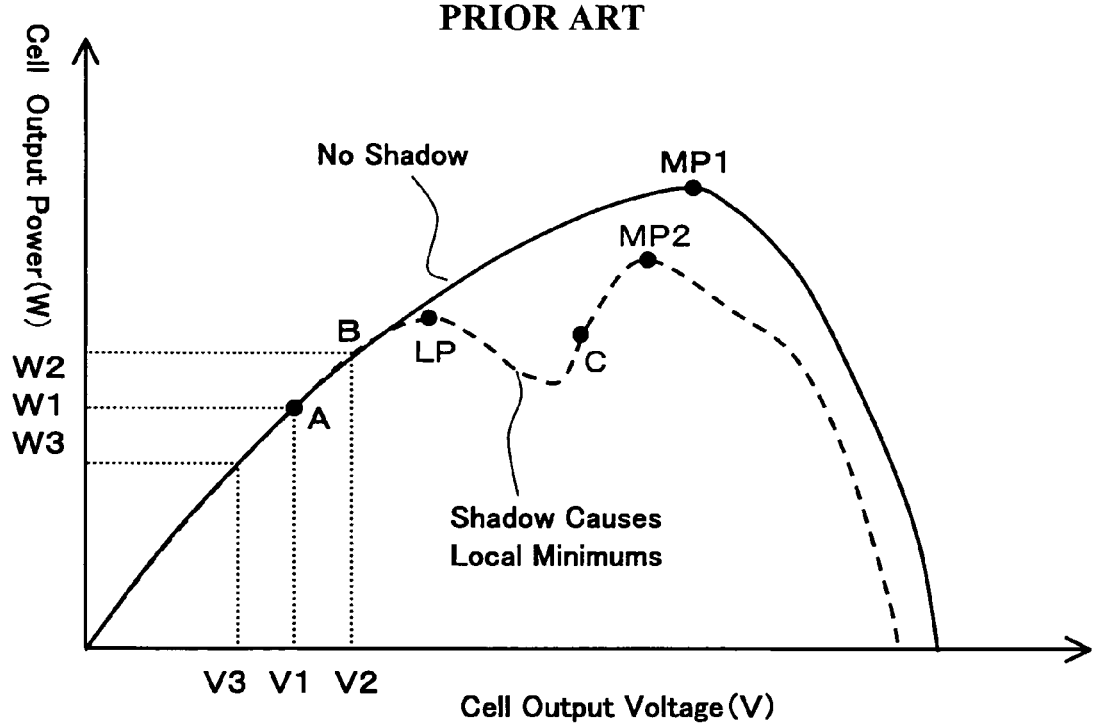
FIG. 7 is a graphs for explaining the tracking of the maximal value in the conventional photovoltaic power generation system.

After the gene production process ends (supposing that the last gene group is the nth generation), a gene having the highest evaluation value (output power) is selected from the group of the nth generation. Then, the photovoltaic output setting value corresponding to this gene is set as an initial reference value for the hill climbing control. Thereafter, the steps are the same as those described above with reference to FIG. 6.

Specifically, based on the initial reference value, the inverter is operated, and the output power of the solar cells is calculated and saved in a memory. Then, a second photovoltaic output setting value, which is greater than the initial reference value, is selected, and based on this second value, the output power of the solar cells is calculated and saved. Further, a third photovoltaic output setting value, which is smaller than the initial reference value, is selected, and based on this third value, the output power of the solar cells is calculated and saved. Then, the three output powers are compared to find the greatest output power.

Thereafter, the photovoltaic output setting value corresponding to the greatest output power is set as the second reference value, and the above-described process is repeated, until the maximum output power or an approximation thereof is obtained. Then, according to the present invention, in order to follow up a variation in photovoltaic voltage-power characteristic caused by a change in the solar irradiation, the process is returned to the genetic algorithm control when a predetermined switching condition is satisfied. For instance, when the hill climbing control takes an unduly long time, the process returns to the genetic algorithm control. Other examples of the switching condition are a change of the voltage-power characteristics of the solar cells, elapse of a predetermined time, a change of the air temperature, or a change of solar irradiation.

Figure 2:
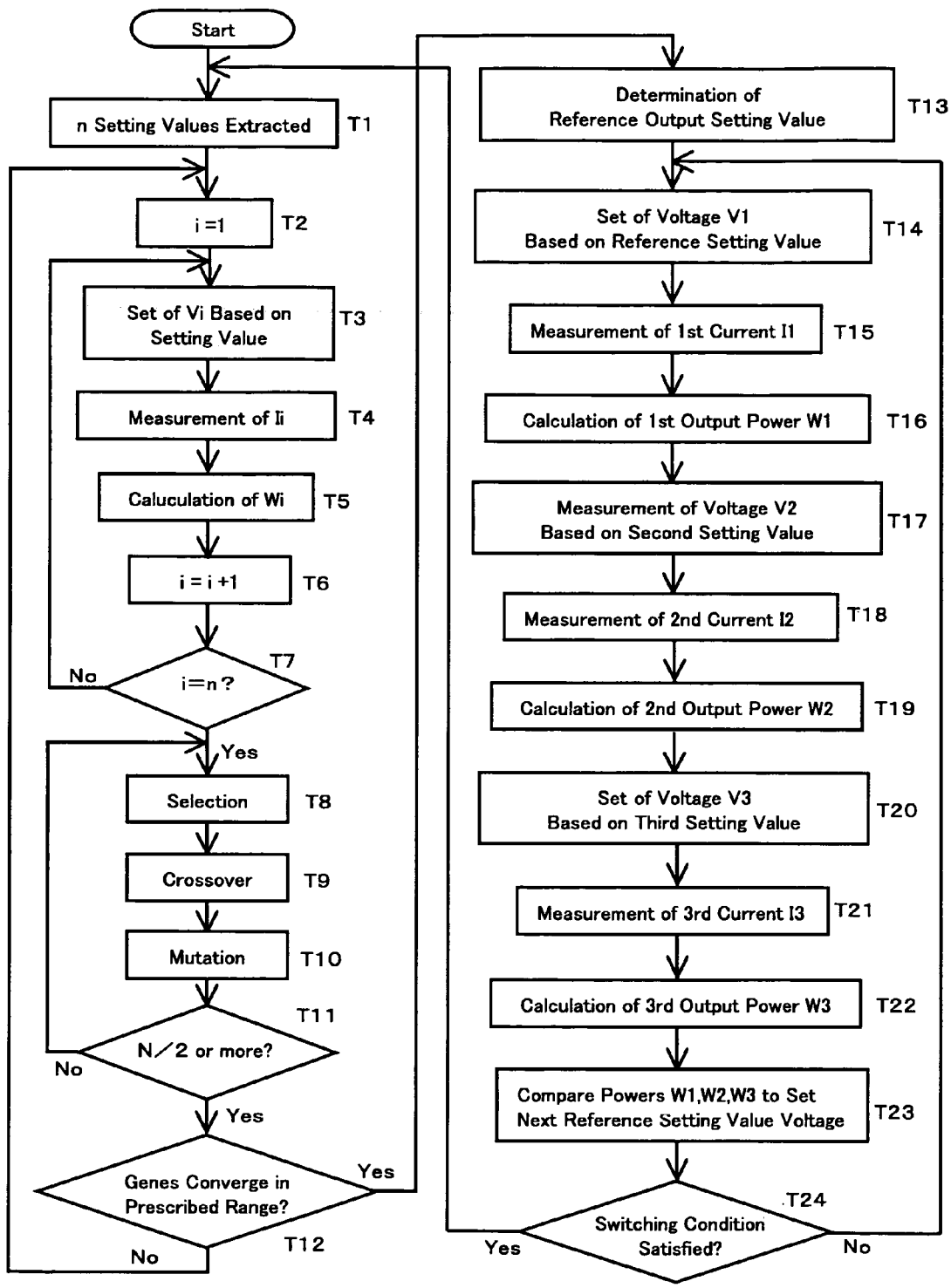
FIG. 2 is a flowchart for explaining the operation of the photovoltaic power generation system of the present invention.

FIG. 2 is a flowchart for explaining the operation of the photovoltaic power generation system according to a first embodiment of the present invention. The operation of the photovoltaic power generation system will be described below with reference to the flowchart and FIGS. 3A–3C.

First, n pieces of genes are randomly extracted from photovoltaic output setting values in a predetermined setting range (step T1). Meanwhile, the counter number i is set to 1 (step T2).

The photovoltaic output setting value corresponding to one of the n genes is selected as a first photovoltaic output setting value, and based on the selected value, the inverter is operated, to measure a first photovoltaic output voltage V1 (step T3). Meanwhile, a first photovoltaic output current I1, corresponding to the first photovoltaic output setting value, is also measured (step T4). The microprocessor of the controller CC multiplies the first photovoltaic output voltage V1 and the first photovoltaic output current I1 to calculate a first photovoltaic output power W1, and store the voltage V1 and the output power W1 in the memory (step T5). The counter i is incremented by 1 (step T6).

Then it is decided whether the output powers of all the n pieces (10 pieces for example) of photovoltaic output setting values have been measured. In the case of "No" the process returns to the step T3, so that the photovoltaic output setting value corresponding to a predetermined gene among the (n-1) pieces of gene is selected as a second photovoltaic output setting value, based on which the inverter is operated, to measure a second photovoltaic output voltage V2 (step T3). Meanwhile, a second photovoltaic output current I2 corresponding to the second photovoltaic output setting value is also measured (step T4). The microprocessor of the controller CC multiplies the second photovoltaic output voltage V2 and the second photovoltaic output current I2, to calculate the second photovoltaic output power W2, and stores the voltage V2 and the output power W2 in the memory (step T5). The counter i is incremented by 1 (step T6).

The foregoing process is repeated, so that the nth photovoltaic output voltage Vn corresponding to the nth photovoltaic output setting value is measured, to calculate the nth photovoltaic output power Wn and stored the voltage Vn and the output power Wn in the memory. Thus, an initial group of a first generation is formed as shown in FIG. 3A (step T7).

Then, two pieces of gene are randomly extracted out of the initial group, and the one that has the greater photovoltaic output power is selected. The same procedure is performed again to select another gene (thus, two genes are currently obtained) (step T8).

The two pieces of genes thus selected are each converted into a binary character string, so as to generate two new genes through a crossover. The crossover occurs at a desired point with a predetermined probability (step T9).

The genes thus generated through the crossover are mutated by changing a part of the character string with a predetermined low probability (step T10).

Then, when a series of the selection, crossover and mutation has been performed less than n/2 times (n=10, for example), the process returns to the step T8 (step T11). Otherwise (n/2 times or more), the process proceeds to step 12, and the foregoing steps are repeated to produce a new generation of the genes. In this manner, a gene group of the nth generation is formed as shown in FIG. 3B. The nth generation gene group includes a gene corresponding to the maximum photovoltaic setting value and a gene corresponding to the minimum photovoltaic setting value. When the difference ΔV between the maximum and the minimum values is greater than a predetermined threshold, the process returns to step T8. On the other hand, when the difference ΔV falls in a predetermined range, the process proceeds to step T13 (step 12).

The photovoltaic output setting value corresponding to the gene that has the greatest evaluation value among the genes converged through the genetic algorithm process is selected as an initial reference photovoltaic output setting value (step T13).

The inverter is activated based on the first photovoltaic output setting value (reference photovoltaic output setting value), to measure a first photovoltaic output voltage V1 shown in FIG. 3C (step T14). Meanwhile, a first photovoltaic output current I1, outputted according to the first photovoltaic output setting value, is also measured (step T15). The microprocessor of the controller CC multiplies the first photovoltaic output voltage V1 and the first photovoltaic output current I1, to calculate the first photovoltaic output power W1 and save the first photovoltaic output voltage V1 and the first photovoltaic output power W1 in the memory (step T16).

Then, a second photovoltaic output setting value, greater than the first photovoltaic output setting value, is determined. Based on this setting value, the inverter is operated. As shown in FIG. 3C, a second photovoltaic output voltage V2 is measured (step T17).

Meanwhile, a second photovoltaic output current I2, outputted according to the second photovoltaic output setting value, is also measured (step T18). The microprocessor of the controller CC multiplies the second photovoltaic output voltage V2 and the second photovoltaic output current I2 thus to calculate the second photovoltaic output power W2 and save the second photovoltaic output voltage V2 and the second photovoltaic output power W2 in the memory (step T19).

Then, a third photovoltaic output setting value, lower than the first photovoltaic output setting value, is determined. Based on this setting value, the inverter is operated. As shown in FIG. 3C again, a third photovoltaic output voltage V3 is measured (step T20).

Meanwhile, a third photovoltaic output current I3, outputted according to the third photovoltaic output setting value, is also measured (step T21). The microprocessor of the controller CC multiplies the third photovoltaic output voltage V3 and the third photovoltaic output current I3, to calculate the third photovoltaic output power W3 and save the third photovoltaic output voltage V3 and the third photovoltaic output power W3 in the memory (step T22).

The output powers W1, W2 and W3, corresponding to the photovoltaic output voltages V1, V2 and V3 (V3<V1<V2) obtained as above and shown in FIG. 3C, are compared, to select the photovoltaic output setting value corresponding to the greatest output power. The selected photovoltaic output setting value is used as the second reference setting value for the hill climbing method (step T23). By repeating such series of steps so as to sequentially update the reference photovoltaic output setting values, it is possible to approach the real maximum power point.

According to the present invention, the foregoing genetic algorithm process allows reaching a point close to the greatest local maximal value, and then the hill climbing process enables quick arriving at the maximum maximal value.

After the step T23, the process proceeds to step T24 where it is determined whether or not a switching condition for the hill climbing process is satisfied (examples of the switching condition are mentioned above). When the switching condition is satisfied, the process returns to the step T1 in the genetic algorithm process. With such an arrangement, it is possible to deal with a variation in the photovoltaic voltage-power characteristic caused by a change in the solar irradiation (due to shadow coverage, for example). In other words, when the solar irradiation has changed so as to deform the profile of a plurality of maximal values in the photovoltaic voltage-power characteristic as shown in FIG. 4A, the process returns to the genetic algorithm process, thereby searching for a point close to an modified maximum maximal value.

Then the steps T13–T23 in the flowchart of FIG. 2 are repeated so as to update the gene group generation, as shown in FIG. 4B, until the difference ΔV between the maximum value and the minimum value among the photovoltaic output voltages (photovoltaic output setting values) corresponding to the genes of the nth generation group falls within a predetermined range.

Then the output powers W1, W2 and W3, corresponding to the photovoltaic output voltages V1, V2 and V3 (V3<V1<V2) shown in FIG. 4C, are compared, thereby obtaining the reference photovoltaic output setting value based on the greatest output power. Repeating such series of steps so as to sequentially update the reference photovoltaic output setting values leads to tracking the maximum power point.

SECOND EMBODIMENT

A second embodiment of the present invention is different from the above-described first embodiment in that an additional hill climbing is performed before the genetic algorithm control. In the additional hill climbing process, a predetermined photovoltaic output setting value is utilized as the initial reference photovoltaic output setting value. Referring to FIG. 2, according to the second embodiment, an additional hill climbing (T13–T24) is performed before the genetic algorithm control T1–T12.

In general, a photovoltaic power generation system normally starts the operation when the sun rises in the morning. When the solar cell panel is installed at a location where there is no likelihood that a shadow is cast on any part of the solar cell panel, the method according to the second embodiment, wherein the hill climbing process is first performed, ensures a quicker arriving at the maximum output power point. Then, when the photovoltaic voltage-power characteristic is varied because of a change in the solar irradiation, the operation can be switched to the genetic algorithm process, so as to search for a point closest to the maximum maximal value among a plurality of maximal values.

THIRD EMBODIMENT

A third embodiment of the present invention is basically the same as or similar to the first or second embodiment described above, except that the switching condition for the hill climbing is specified. Specifically, according to the third embodiment, the hill climbing is changed to the genetic algorithm process when the hill climbing process has been performed for a predetermined duration of time. When the hill climbing process has been performed for a predetermined time, the solar irradiation may have changed, thereby causing a variation in the photovoltaic voltage-power characteristic and a shift of the maximum output power point. According to the third embodiment, the operation is switched to the genetic algorithm process after the predetermined time has lapsed. This allows timely searching for a point closest to the maximum maximal value among a plurality of maximal values, thereby properly tracking the maximum output power point.

FOURTH EMBODIMENT

According to a fourth embodiment of the present invention, the switching condition is satisfied when the output power of the solar cells fluctuates by more than a predetermined value with respect to the output power of the preceding step. In the fourth embodiment, a variation in the photovoltaic voltage-power characteristic caused by a change in the solar irradiation is detected through the variation in the output power by more than the predetermined value, so as to switch the operation to the genetic algorithm process. This allows timely searching for a point closest to the maximum maximal value among a plurality of maximal values, thereby properly tracking the maximum output power point.

FIFTH EMBODIMENT

According to a fifth embodiment of the present invention, the switching condition is satisfied when the output power has fluctuated by more than a predetermined value with respect to the output power of the preceding step and when the hill climbing process has been performed for a predetermined duration of time. According to the fifth embodiment, a variation in the photovoltaic voltage-power characteristic caused by a change in the solar irradiation is detected through the variation in the output power by more than the predetermined-value, and the operation is switched to the genetic algorithm process when the hill climbing process has been performed for a predetermined time. This allows effectively following up the variation in the solar irradiation, and prevents a premature switching to the genetic algorithm process after only a short duration of the hill climbing process. This is advantageous since frequent premature switching from the hill climbing process may rather lower the overall working efficiency of the photovoltaic power generation system.

SIXTH EMBODIMENT

A sixth embodiment of the present invention is basically the same or similar to any one of the first through fifth embodiments of the present invention, except that the initial group is caused to contain the gene corresponding to the reference photovoltaic output setting value of the last step of the hill climbing process, when the transition from the hill climbing process to the genetic algorithm process occurs. In the sixth embodiment, the initial group referred to at the step T1 is formed including the gene corresponding to the reference photovoltaic output setting value of the last step T23 of the hill climbing process in the flowchart of FIG. 2, at the transition from the hill climbing process to the genetic algorithm process. According to the sixth embodiment, the presence of the gene having a high evaluation value in the initial group increases the converging speed in the genetic algorithm process.

The invention claimed is:

1. A method of controlling a photovoltaic power generation system including controlling an inverter such that an output voltage or an output current from a solar cell becomes generally equal to a photovoltaic output setting value, so as to deal with a variation in a photovoltaic voltage-power characteristic caused by a change of the solar irradiation, the method for controlling the photovoltaic output setting value to be an appropriate value that makes the output power of the solar cell generally equal to a maximum value, the method comprising:

a genetic algorithm process including employing a GA controller based on a genetic algorithm in which the photovoltaic output setting value serves as a gene and the output power of the solar cell serves as an evaluation value of the gene; a first step including extracting a plurality of genes randomly or according to a predetermined condition out of a setting range of the photovoltaic output setting value thus to form an initial group of a first generation, sequentially activating the inverter based on each photovoltaic output setting value respectively corresponding to each gene of the initial group and storing the output power from the solar cell under operation as the evaluation value of each of the genes, and inputting the genes of the initial group in the GA controller, so that the GA controller selects the genes and causes the selected genes to crossover/mutate based on the evaluation value thereof, so as to output a predetermined number of genes thus to form a second generation group; a second step including sequentially activating the inverter based on the photovoltaic output setting values corresponding to the genes of the second generation group and storing the output power from the solar cell under operation as the evaluation value of each of the genes, and inputting the second generation genes in the GA controller, so that the GA controller selects the genes and causes the selected genes to crossover/mutate based on the evaluation value thereof, so as to output a predetermined number of genes thus to form a third generation group; and repeating the second step so as to converge the genes thus to update the generation of the gene group, until a difference between a maximum value and a minimum value among the photovoltaic output setting values corresponding to the genes falls within a predetermined range; and a hill climbing process including selecting a photovoltaic output setting value that has the greatest evaluation value among the converged genes as a reference photovoltaic output setting value; generating a value greater by a predetermined amount and lower by a predetermined amount than the reference photovoltaic output setting value; sequentially activating the inverter based on the three photovoltaic output setting values so as to set the photovoltaic output setting value that gives the greatest output power as an updated reference photovoltaic output setting value; and repeating such steps, so as to return to the genetic algorithm process when a predetermined switching condition for following up the variation in the photovoltaic voltage-power characteristic is satisfied.

2. The control method according to claim 1, further comprising performing, upon starting the control of the photovoltaic power generation system, the hill climbing process utilizing a predetermined photovoltaic output setting value as the reference photovoltaic output setting value, prior to performing the genetic algorithm process.

3. The control method according to claim 1, wherein the hill climbing process includes specifying the switching condition as when the hill climbing process has been performed for a predetermined duration of time.

4. The control method according to claim 2, wherein the hill climbing process includes specifying the switching condition as when the hill climbing process has been performed for a predetermined duration of time.

5. The control method according to claim 1, wherein the hill climbing process includes specifying the switching condition as when the output power has fluctuated by more than a predetermined value with respect to the output power of the preceding step.

6. The control method according to claim 2, wherein the hill climbing process includes specifying the switching condition as when the output power has fluctuated by more than a predetermined value with respect to the output power of the preceding step.

7. The control method according to claim 1, wherein the hill climbing process includes specifying the switching condition as when the output power has fluctuated by more than a predetermined value with respect to the output power of the preceding step, and when the hill climbing process has been performed for a predetermined duration of time.

8. The control method according to claim 2, wherein the hill climbing process includes specifying the switching condition as when the output power has fluctuated by more than a predetermined value with respect to the output power of the preceding step, and when the hill climbing process has been performed for a predetermined duration of time.

9. The control method according to claim 1, further comprising forming the initial group containing the genes corresponding to the reference photovoltaic output setting value of the last step of the hill climbing process, at a transition from the hill climbing process to the genetic algorithm process.

10. The control method according to claim 2, further comprising forming the initial group containing the genes corresponding to the reference photovoltaic output setting value of the last step of the hill climbing process, at a transition from the hill climbing process to the genetic algorithm process.

11. The control method according to claim 3, further comprising forming the initial group containing the genes corresponding to the reference photovoltaic output setting value of the last step of the hill climbing process, at a transition from the hill climbing process to the genetic algorithm process.

12. The control method according to claim 4, further comprising forming the initial group containing the genes corresponding to the reference photovoltaic output setting value of the last step of the hill climbing process, at a transition from the hill climbing process to the genetic algorithm process.

13. The control method according to claim 5, further comprising forming the initial group containing the genes corresponding to the reference photovoltaic output setting value of the last step of the hill climbing process, at a transition from the hill climbing process to the genetic algorithm process.

14. The control method according to claim 6, further comprising forming the initial group containing the genes corresponding to the reference photovoltaic output setting value of the last step of the hill climbing process, at a transition from the hill climbing process to the genetic algorithm process.

15. The control method according to claim 7, further comprising forming the initial group containing the genes corresponding to the reference photovoltaic output setting value of the last step of the hill climbing process, at a transition from the hill climbing process to the genetic algorithm process.

16. The control method according to claim 8, further comprising forming the initial group containing the genes corresponding to the reference photovoltaic output setting value of the last step of the hill climbing process, at a transition from the hill climbing process to the genetic algorithm process.

* * * * *